(12) United States Patent
Lin et al.

(10) Patent No.: US 10,230,137 B2
(45) Date of Patent: Mar. 12, 2019

(54) ESTIMATING CORE TEMPERATURES OF BATTERY CELLS IN A BATTERY PACK

(71) Applicants: The Regents of the University of Michigan, Ann Arbor, MI (US); The United States of America, as represented by the Secretary of the Army, Washington, D.C., Washington, DC (US)

(72) Inventors: Xinfan Lin, Ypsilanti, MI (US); Yi Ding, Canton, MI (US); Matthew P. Castanier, Ann Arbor, MI (US); Anna G. Stefanopoulou, Ann Arbor, MI (US)

(73) Assignees: The Regents of the University of Michigan, Ann Arbor, MI (US); The United States of America, by Sec. of the Army, Washington, DC (US)

( * ) Notice: Subject to any disclaimer, the term of this patent is extended or adjusted under 35 U.S.C. 154(b) by 0 days.

(21) Appl. No.: 14/403,057

(22) PCT Filed: May 23, 2013

(86) PCT No.: PCT/US2013/042496
§ 371 (c)(1),
(2) Date: Nov. 21, 2014

(87) PCT Pub. No.: WO2013/177442
PCT Pub. Date: Nov. 28, 2013

(65) Prior Publication Data
US 2015/0147608 A1 May 28, 2015

Related U.S. Application Data

(60) Provisional application No. 61/650,760, filed on May 23, 2012.

(51) Int. Cl.
*H01M 10/48* (2006.01)
*H01M 10/052* (2010.01)
(Continued)

(52) U.S. Cl.
CPC ............ *H01M 10/486* (2013.01); *G01K 7/42* (2013.01); *G01R 31/3648* (2013.01);
(Continued)

(58) Field of Classification Search
CPC .............. H01M 10/052; H01M 10/486; G01R 31/3648
(Continued)

(56) References Cited

U.S. PATENT DOCUMENTS 5,711,605 A 1/1998 Reher et al.
6,076,964 A 6/2000 Wu et al.
(Continued)

FOREIGN PATENT DOCUMENTS

DE 102011102367 A1 12/2011
DE 102011116779 A1 5/2012
(Continued)

OTHER PUBLICATIONS

International Search Report for application No. PCT/US2013/042496, dated Aug. 19, 2013, 3 pages.
(Continued)

*Primary Examiner* — Miriam Stagg
*Assistant Examiner* — Victoria H Lynch
(74) *Attorney, Agent, or Firm* — Reising Ethington P.C.

(57) ABSTRACT

A method and a system of estimating core temperatures of battery cells in a battery pack can include several steps. In one step, a surface temperature of one or more battery cell(s) is received, a current of the one or more battery cell(s) is received, an inlet temperature of coolant provided to the battery pack is received, and a flow rate or velocity of the
(Continued)

coolant is received. In another step, estimations are made including those of a cell-lumped internal electrical resistance of the battery cell(s), a cell-lumped conduction resistance between a core and a surface of the battery cell(s), and a cell-lumped convection resistance between the surface and the coolant. In yet another step, an estimation is made of a core temperature of the battery cell(s) based upon the received and estimated values of previous steps.

16 Claims, 4 Drawing Sheets

(51) Int. Cl.
G01K 7/42 (2006.01)
G01R 31/36 (2019.01)
H01M 10/633 (2014.01)
H01M 10/6557 (2014.01)

(52) U.S. Cl.
CPC ...... G01R 31/3662 (2013.01); H01M 10/052 (2013.01); H01M 10/482 (2013.01); H01M 10/633 (2015.04); H01M 10/6557 (2015.04); Y02T 10/7011 (2013.01)

(58) Field of Classification Search
USPC .............................................. 429/62; 702/63
See application file for complete search history.

(56) References Cited

U.S. PATENT DOCUMENTS

| | | | |
|---|---|---|---|
| 8,775,105 | B2 | 7/2014 | Lin et al. |
| 8,936,394 | B2 | 1/2015 | Kenkre et al. |
| 2007/0139017 | A1 | 6/2007 | Marchand et al. |
| 2011/0299564 | A1 | 12/2011 | Leutheuser et al. |
| 2012/0109554 | A1 | 5/2012 | Lin et al. |

FOREIGN PATENT DOCUMENTS

| | | |
|---|---|---|
| JP | 2003185504 A | 7/2003 |
| WO | WO9734133 A1 | 9/1997 |

OTHER PUBLICATIONS

Written Opinion for application No. PCT/US2013/042496, dated Aug. 19, 2013, 6 pages.

Lin, Xinfan et al., "On-line Parameterization of Lumped Thermal Dynamics in Cylindrical Lithium Ion Batteries for Core Temperature Estimation and Health Monitoring", IEEE Transactions on Control System Technology, Oct. 3, 2012, vol. PP, Issue:99, Digital Object Identifier: 10.1109/TCST.2012.2217143, pp. 1-11.

Extended European Search Report corresponding to application No. EP13794397, dated Jan. 20, 2016, 9 pages.

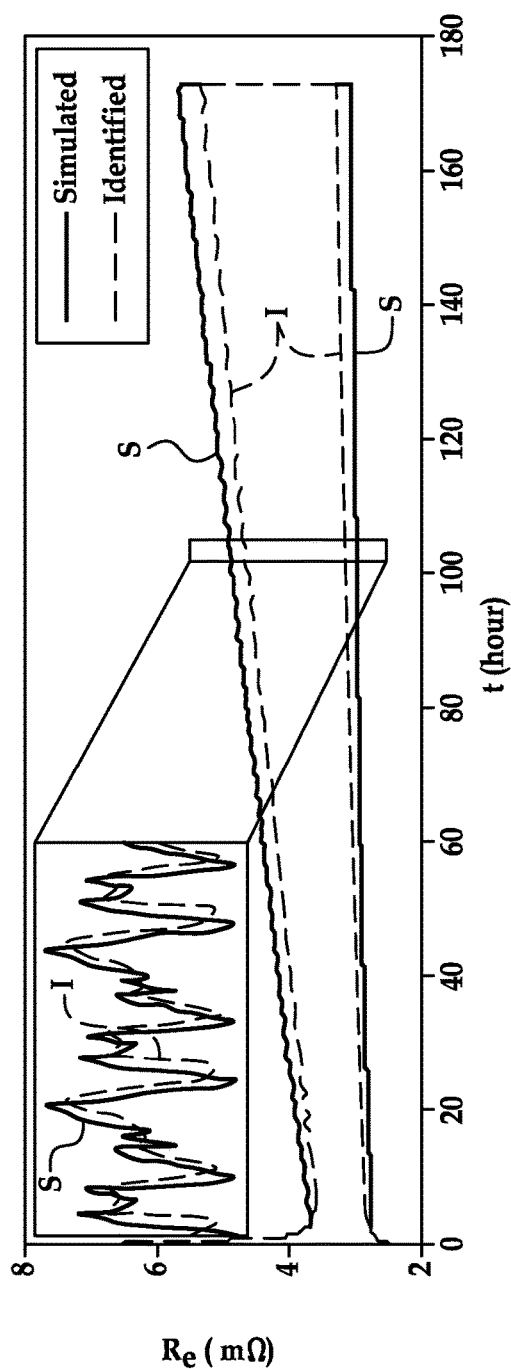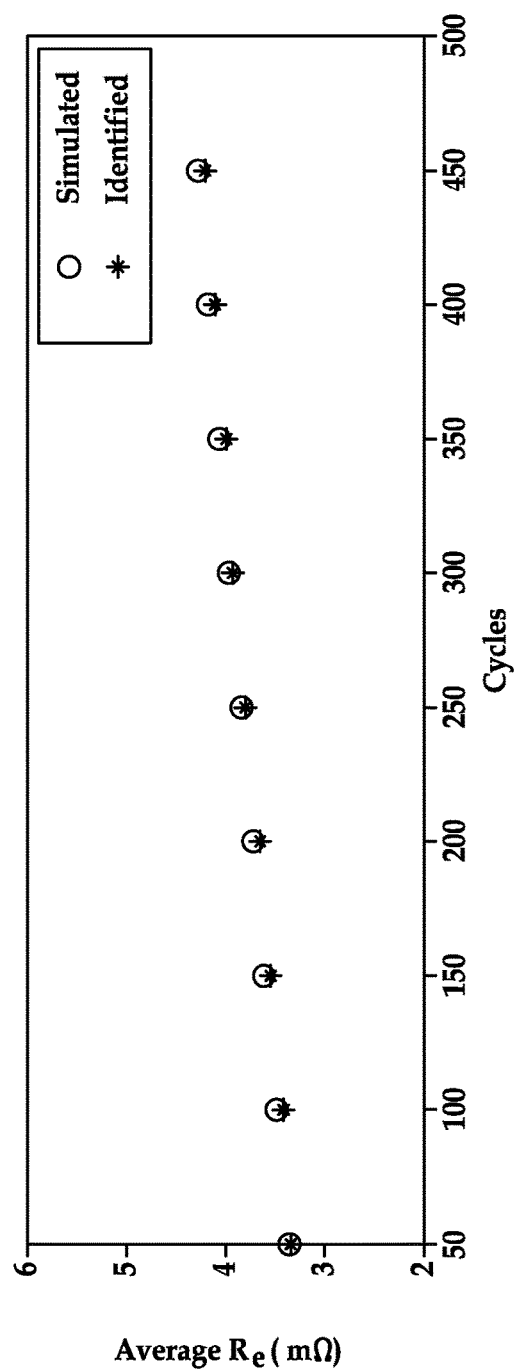

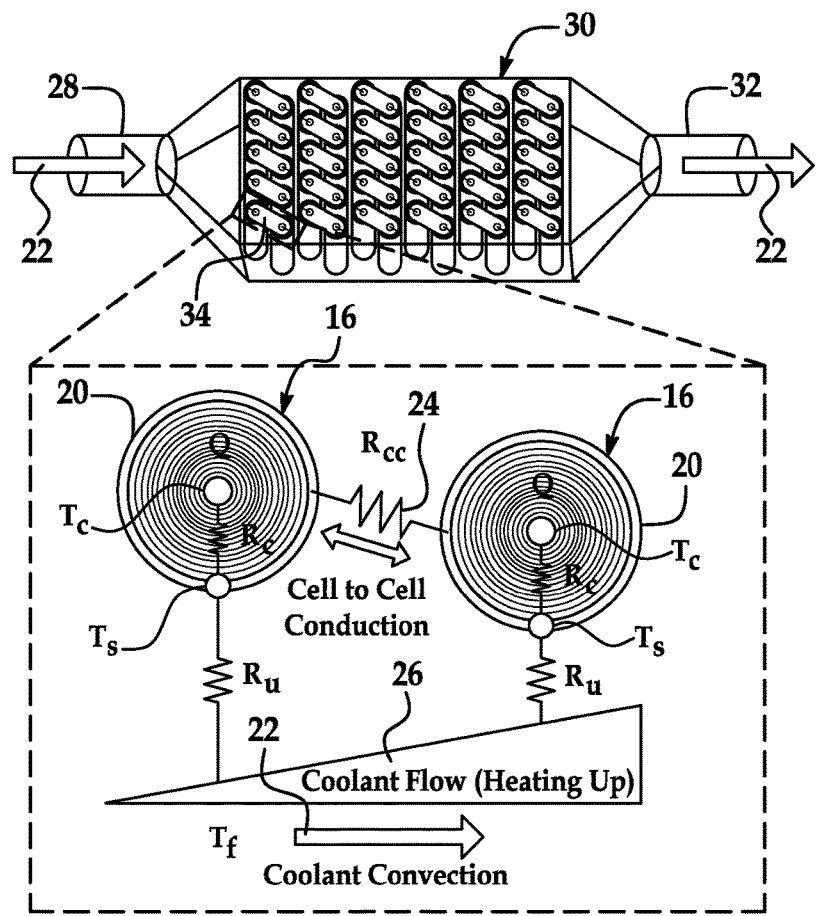
FIG. 3
 Sensor location
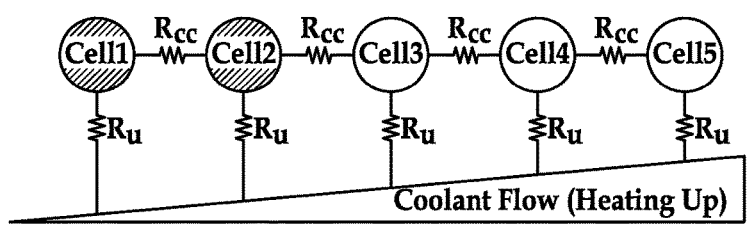
Rank (Q) = 9 (Not fully observable)
FIG. 5A
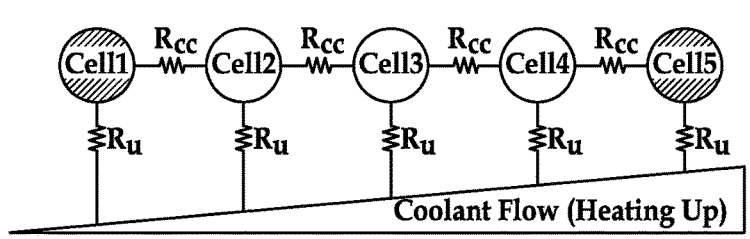
Rank (Q) = 10 (Fully observable)
FIG. 5B

ESTIMATING CORE TEMPERATURES OF BATTERY CELLS IN A BATTERY PACK

CROSS-REFERENCE TO RELATED APPLICATION

This application claims the benefit of U.S. Provisional Application No. 61/650,760 filed May 23, 2012, the entire contents of which are hereby incorporated by reference.

GOVERNMENT LICENSE RIGHTS

This invention was made with government support under W56 HZV-04-2-0001 awarded by the U.S. Army TACOM. The government has certain rights in the invention.

TECHNICAL FIELD

This invention relates generally to batteries, and particularly relates to ways of estimating temperatures of battery cells in a battery pack, such as core temperatures.

BACKGROUND OF THE INVENTION

Batteries such as lithium-ion batteries are a common source of electrical energy for mobile phones, tablet and laptop computers, hybrid electric vehicles (HEVs), plug-in hybrid electric vehicles (PHEVs), battery electric vehicles (BEVs), industrial equipment such as forklifts and robots, stationary power generators such as solar power generators and wind power generators, as well as other applications. A lithium-ion battery in these types of applications typically includes a battery pack made up of numerous individual battery cells—sometimes hundreds or thousands of cells. During use, the charging and discharging performance and the life of the batteries can degrade appreciably due to rising internal core temperatures of the battery cells. In some cases, lithium-ion batteries have been shown to exhibit a somewhat confined window of temperatures in which they can effectively perform (e.g., −10° C. to 50° C.). Accordingly, attempts have been made to monitor the internal core temperatures of battery cells in order to better manage cooling systems of the battery pack and hence the temperatures of the batteries.

Past attempts, however, have been fraught with shortcomings and can be largely inaccurate, unreliable, and in some cases impractical. In one example, a surface temperature of a battery cell is measured and taken as its core temperature. But this can be grossly inaccurate as temperatures between the surface and the core can differ by as much as 30° C. In another example, temperature sensors are installed inside of a battery cell's internal core to take temperature measurements at the core. But this can be impractical due to the accompanying cost for equipping the hundreds or even thousands of battery cells often found in the types of applications mentioned above.

SUMMARY OF THE INVENTION

According to one embodiment, a method of estimating core temperatures of battery cells in a battery pack includes several steps. In one step, a surface temperature of less than all of the battery cells in the battery pack is dynamically received, a current of the less than all battery cells is dynamically received, an inlet temperature of coolant provided to the battery pack is dynamically received, and a flow rate or velocity of the coolant is dynamically received. In another step, a cell-lumped internal electrical resistance of the less than all battery cells is dynamically estimated, a cell-lumped conduction resistance between a core and a surface of the less than all battery cells is dynamically estimated, and a cell-lumped convection resistance between the surface of the less than all battery cells and the coolant is dynamically estimated; the estimations in this step are based in part or more upon the received values of the previous step. In yet another step, a core temperature of the less than all battery cells is dynamically estimated based in part or more upon the received and estimated values of the previous steps. And in another step, thermal energy transfer effects between the coolant and the battery cells are used, thermal energy transfer effects among the battery cells are used, and the estimated core temperature values of the previous step are used, all in order to estimate the core temperatures for all of the battery cells in the battery pack.

According to another embodiment, a method of estimating core temperatures of battery cells in a battery pack includes several steps. In one step, a surface temperature of one or more battery cells in the battery pack is dynamically received, a current of the one or more battery cells is dynamically received, an inlet temperature of coolant provided for the battery pack is dynamically received, and a flow rate or velocity of the coolant is dynamically received. In another step, a cell-lumped internal electrical resistance of the one or more battery cells is dynamically estimated, a cell-lumped conduction resistance between a core and a surface of the one or more battery cells is dynamically estimated, and a cell-lumped convection resistance between the surface of the one or more battery cells and the coolant is dynamically estimated; the estimations in this step are based in part or more upon the received values of the previous step. In yet another step, a core temperature of the one or more battery cells is dynamically estimated, and a surface temperature of the one or more battery cells is dynamically estimated; the estimations in this step are based in part or more upon the received and estimated values of the previous steps. And in another step, the received surface temperature values and estimated surface temperature values of previous steps are compared with each other in order to correct the estimation of the core and surface temperatures of the one or more battery cells.

According to another embodiment, a system for estimating core temperatures of battery cells in a battery pack includes one or more sensors, a controller, and a battery thermal management assembly. The one or more sensors are coupled to one or more battery cells of the battery pack in order to measure a surface temperature of the one or more battery cells. The controller is coupled, directly or indirectly, to the one or more sensors in order to receive the measured surface temperature. The controller performs the steps of: i) receiving a current of the one or more battery cells, receiving an inlet temperature of coolant provided to the battery pack, and receiving a flow rate or velocity of the coolant; ii) estimating a cell-lumped internal electrical resistance of the one or more battery cells, estimating a cell-lumped conduction resistance between a core and a surface of the one or more battery cells, and estimating a cell-lumped convection resistance between the surface of the one or more battery cells and the coolant; the estimations in this step are based in part or more upon the measured surface temperature and the received values of step i); iii) estimating a core temperature of the one or more battery cells based in part or more upon the measured surface temperature, the received values of step i), and the estimated values of step ii); and iv) using thermal energy transfer effects between the coolant and the battery cells, using thermal energy transfer effects among the battery cells, and using the estimated core temperature values of step iii), all in order to estimate the core temperatures for all of the battery cells in the battery pack. The battery thermal management assembly is electrically coupled, directly or indirectly, to the controller and is controlled by the controller based in part or more upon the estimated core temperatures for all of the battery cells in the battery pack.

BRIEF DESCRIPTION OF THE DRAWINGS

Preferred exemplary embodiments of the invention will hereinafter be described in conjunction with the appended drawings, wherein like designations denote like elements, and wherein:

FIG. 2A is a graph comparing simulated results of internal electrical resistance growth with internal electrical resistance growth identified by an embodiment of an identification algorithm;

FIG. 2B is a graph comparing average internal electrical resistance growth of simulated results with average internal electrical resistance growth identified by the identification algorithm;

FIG. 3 is a diagrammatic view showing thermal energy transfer effects between two individual battery cells, and between coolant and the battery cells;

FIG. 5A is a diagrammatic view showing state observability conditions based on a location of temperature sensors among battery cells; and FIG. 5B is a diagrammatic view similar to FIG. 5A, but with temperature sensors at different locations than those in FIG. 5A.

DETAILED DESCRIPTION OF THE PREFERRED EMBODIMENTS

Figure 1:
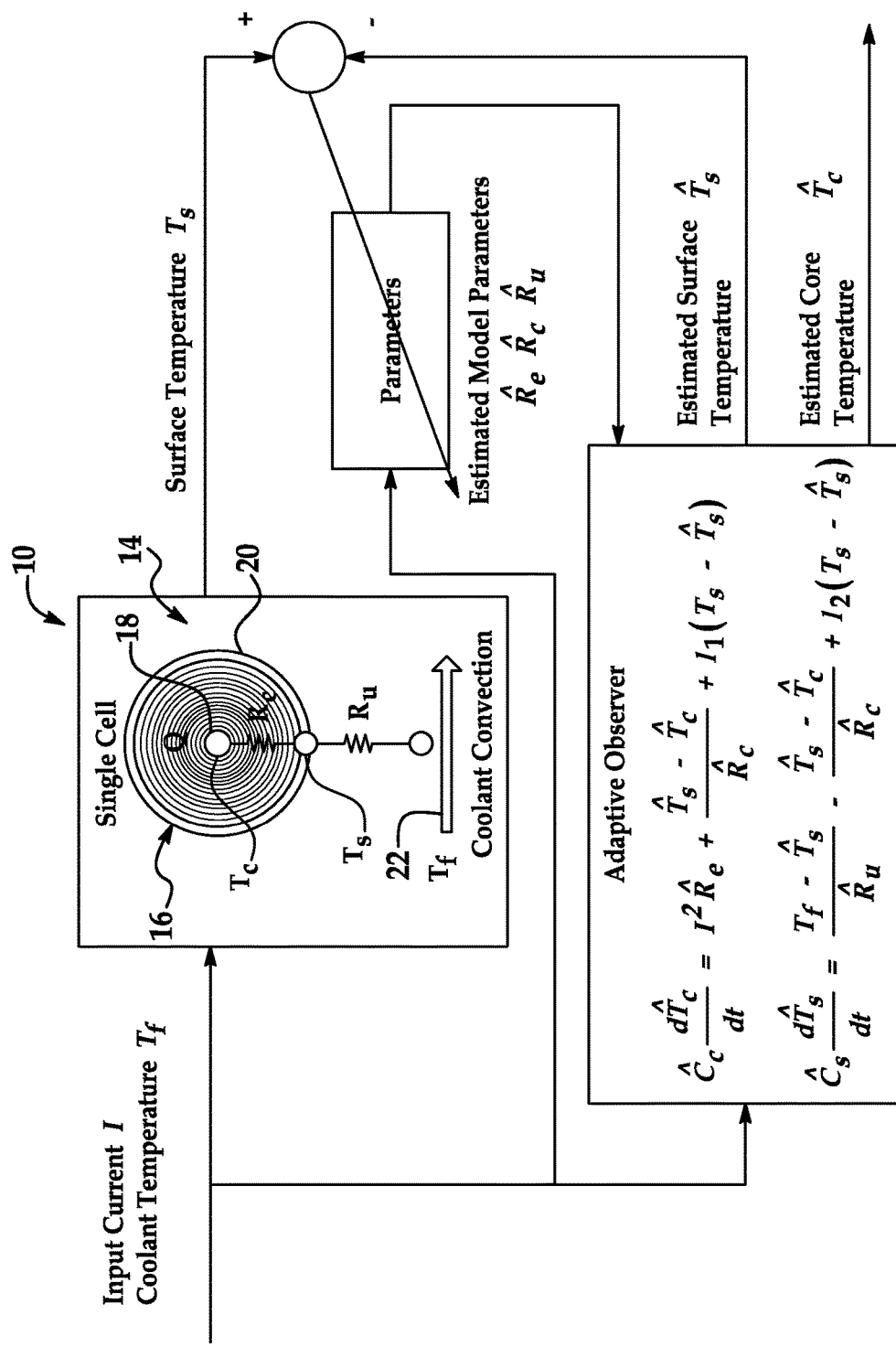
FIG. 1 is a diagrammatic view of an embodiment of a parameter identifier and an adaptive observer used with a method of, and a system for, estimating core temperatures of battery cells in a battery pack.

The present disclosure provides embodiments of methods and systems for estimating a core temperature in a battery cell of a battery pack in a way that is more accurate, precise, and reliable than previously known. The core temperature estimation can then be used for battery thermal management system operation and to facilitate maintaining safety, performance, and longevity, among other possibilities. In one embodiment the methods and systems provide an estimation of a core temperature while only using a sensed surface temperature value of the battery cell and other values commonly observed in batteries such as current. In another embodiment core temperatures for all of the battery cells in the battery pack can be estimated using thermal energy transfer effects and without providing sensors or otherwise physically measuring temperature at all of the cells. Still, the methods and systems can provide dynamic estimation where values are regularly and continuously received in real time throughout use of the battery, and estimations are regularly and continuously performed. In yet another embodiment, accuracy and preciseness of the core temperature estimation is facilitated by a closed-loop feedback functionality, which also eliminates the need for initial temperature determination of the battery cell as is often required in known methods.

Furthermore, the methods and systems can provide an approximate determination of the state of health (SOH) of the battery pack based on the growth of internal electrical resistance within the battery cells over time. And lastly, the methods and systems disclosed herein can provide temperature sensor deployment strategies among the battery cells in the battery pack such as the actual quantity of sensors and placement and location of the sensors on the battery cells, and can provide certain design guidance for the cells such as the construction of a connection tab between two cells. All of this is described in greater detail below.

In general, the methods and systems detailed in this description utilize various algorithms, models, formulae, and other functionality that can be stored and performed in a controller such as an electronic control unit (ECU) in a vehicle. As will be known by skilled artisans, the controller can have hardware, software, firmware, or other like components configured and programmed to perform these functions, and can employ memory components, processing components, logic components, lookup tables, or other like components when performing the functions. Also, while this description provides examples of algorithms, models, formulae, and other functionality used to perform the methods and systems herein, skilled artisans will appreciate that other suitable algorithms, models, and formulae may be used as alternatives to perform the methods and systems herein. Furthermore, the temperature measurements referenced in this description can be obtained via a temperature sensor such as a thermistor, thermocouple, thermometer, or other temperature measuring device, and the current measurements referenced in this description can be obtained via an ammeter, a clamp meter, a galvanometer, another current measuring device, or some other way. The sensors and other measurement components can be electrically coupled to the controller—via wires, wirelessly, or some other way—in order to send signals and data for reception by the controller. And while the methods and systems herein are described in the context of lithium-ion batteries, the methods and systems are applicable with batteries of other types such as nickel-metal hydride batteries, and may be performed with battery cells of different sizes, shapes, arrangements, architectures, and connectivity. For example, the methods and systems may be performed with cylindrical batteries, prismatic batteries, batteries with parallel circuitry, and batteries with series circuitry.

Once estimated, the information provided as output by the methods and systems can be used to manage charging, discharging, cooling, and other operations of the battery pack. As an example, during a charging process, if an estimated core temperature is higher than a predetermined threshold, a charging voltage of the battery pack can be reduced in order to prevent overheating of the battery pack. As another example, if the estimated core temperature is higher than the predetermined threshold, a cooling process can be initiated or augmented in order to bring the core temperature below the predetermined threshold. In the example of a vehicle with a lithium-ion battery, the vehicle can be equipped with a battery thermal management system and assembly. The battery thermal management system can be electrically coupled to its accompanying controller for assisting control of the system's operation, and can include a fan, pump, or other device for moving a coolant such as air or liquid around and through the battery pack. The information provided as output could then be used, for example, to turn the battery thermal management system on or off, or adjust its operating state such as from a low level to a higher level of operation. Still, the output information could be used for other purposes and in other ways.

Referring now to FIG. 1, in this embodiment the methods and systems for estimating core temperatures in battery cells of a battery pack involves a parameter identifier 10 and an adaptive observer 12. The parameter identifier 10 automatically identifies parameters of a battery single cell thermal model 14, and the parameters are updated in real time. The thermal model 14 has two states: a core temperature $T_c$ of a cylindrical lithium-ion battery cell 16, and a surface temperature $T_s$ of the battery cell. Governing equations for these states in this embodiment are:

$$C_c \dot{T}_c = I^2 R_e + \frac{T_s - T_c}{R_c}$$

$$C_s \dot{T}_s = \frac{T_f - T_s}{R_u} + \frac{T_s - T_c}{R_c}$$

Heat generated in a core 18 of the battery cell 16 is approximated as a concentrated source of Joule loss, computed as the product of current I squared and internal electrical resistance $R_e$. Thermal energy transfer effects between the core 18 and a surface 20 of the battery cell 16 is modeled by heat conduction over a thermal resistance $R_c$, which is a lumped parameter aggregating the conduction and contact thermal resistance across what-is-oftentimes compact and inhomogeneous materials of the core. A convection resistance $R_u$ is modeled between the surface 20 and a coolant 22 provided to the larger battery pack; the value of the convection resistance $R_u$ can be a function of a rate of coolant flow or velocity of coolant and, in some cases, the coolant flow rate is adjustable depending on the temperature of the battery pack; in this embodiment, it can be modeled as a constant as if the coolant flow rate is fixed in order to accommodate a maximum cooling capacity. Further, the rates of temperature change of the core 18 and the surface 20 depend on their respective lumped heat capacities. That is, a heat capacity $C_c$ of the core 18, and a heat capacity $C_s$ of the surface 20. Accordingly, in this embodiment, parameters of the thermal model 14 include $R_e$, $R_c$, $R_u$, $C_c$, and $C_s$. Because the values of the parameters cannot always be easily calculated, model identification techniques are used to obtain lumped phenomenological values of the parameters based upon measurable inputs and outputs of the thermal model 14.

Parameterization Methodology

In linear model identification techniques, a parametric model $$z = \theta^T \phi$$

is derived by applying Laplace transformation to the model, where z is the observation, $\theta$ is the parameter vector, and $\phi$ is the regressor. Both z and $\phi$ can be measured, or can be determined from measured signals. In this embodiment, a recursive least squares algorithm is applied in an on-line fashion, as parameters are updated continuously (equations (i))

$$\dot{\theta} = P \frac{\varepsilon \phi}{m^2}$$

$$\dot{P} = -P \frac{\phi \phi^T}{m^2} P$$

$$\varepsilon = z - \theta^T \phi$$

$$m^2 = 1 + \phi^T \phi$$

where m is a normalization factor that enhances the robustness of parameter identification, P is the covariance matrix, and $\varepsilon$ is the error in observation.

In this embodiment, in order to make the observation z and the regressors $\phi$ proper or causal, a filter $$\frac{1}{\Lambda(s)}$$

can be applied. The parametric model then becomes $$\frac{z}{\Lambda} = \theta^T \frac{\phi}{\Lambda}$$

In one embodiment, in order to help ensure convergence and robustness of the identification, regressors $\phi$ are stationary signals and satisfy persistent excitation (PE) conditions. The PE conditions are satisfied if there exist some time interval $T_0$, and positive number $\alpha_1$ and $\alpha_0$, such that $$\alpha_1 I_M \geq U(t) = \frac{1}{T_0} \int_t^{t+T_0} \phi(\tau) \phi^T(\tau) d\tau \geq \alpha_0 I_M$$

$$\forall_t \geq 0$$

where $I_M$ is the identity matrix with the same dimension as U(t).

In other embodiments not described here in detail, the parametric model could employ other algorithms for parameter identification such as gradient search, or a non-recursive least squares algorithm could be applied. The above is merely one example.

Parameterization of Battery Thermal Model

The parametric model described above is then applied to the governing equations set forth for the core temperature $T_c$ state and the surface temperature $T_s$ state. Accordingly, a parametric model for identification can be derived by taking the Laplace transformation of the $T_c$ and $T_s$ state equations and replacing unmeasured $T_c$ with measured signals I, $T_f$, and $T_s$ $$s^2 T_s - s T_{s,0} = \frac{R_e}{C_c C_s R_c} I^2 + \frac{1}{C_c C_s R_c R_u}(T_f - T_s) +$$

$$\frac{1}{C_s R_u} s(T_f - T_s) - \frac{1}{C_c C_s R_c}((C_c + C_s) s T_s - C_s T_{s,0} - C_c T_{c,0})$$

where $T_{s,0}$ and $T_{c,0}$ are the initial surface and core temperatures. When the initial core temperature $T_{c,0}$ is considered to be the same as the initial surface temperature $T_{s,0}$, as when the larger battery pack is started from thermal equilibrium, the equation becomes (equation (ii))

$$s^2 T_s - s T_{s,0} =$$

$$\frac{R_e}{C_c C_s R_c} I^2 + \frac{1}{C_c C_s R_c R_u}(T_f - T_s) - \frac{C_c + C_s}{C_c C_s R_c}(sT_s - T_{s,0}) + \frac{1}{C_s R_u} s(T_f - T_s)$$

It is assumed here that $T_f$ is regulated as a steady output of the battery thermal management system and hence $sT_f=0$, giving (equation (iii))

$$s^2 T_s - s T_{s,0} =$$

$$\frac{R_e}{C_c C_s R_c} I^2 + \frac{1}{C_c C_s R_c R_u}(T_f - T_s) - \left(\frac{C_c + C_s}{C_c C_s R_c} + \frac{1}{C_s R_u}\right)(sT_s - T_{s,0})$$

If $T_f$ is a time-varying input to the model, $sT_f$ should not be dropped in this embodiment. Here, $T_f$ can also be used as an input excitation in the parametric model. A second order filter can be applied to the observation and the regressors in the immediately above equation in order to make them proper. The second order filter takes the form $$\frac{1}{\Lambda(s)} = \frac{1}{(s+\lambda_1)(s+\lambda_2)}$$

where $\lambda_1$ and $\lambda_2$ are the time constants of the filter. The values of $\lambda_1$ and $\lambda_2$ can be chosen in order to filter noises with frequencies higher than the temperature dynamics.

For the parametric model, then $$Z(s) = \frac{s^2 T_s - sT_{s,0}}{\Lambda(s)}$$

$$\phi(s) = \left[\frac{I^2}{\Lambda(s)} \quad \frac{T_f - T_s}{\Lambda(s)} \quad \frac{sT_s - T_{s,0}}{\Lambda(s)}\right]^T$$

$$\theta = [\alpha \quad \beta \quad \gamma]^T$$

where $$\alpha = \frac{R_e}{C_c C_s R_c}$$

$$\beta = \frac{1}{C_c C_s R_c R_u}$$

$$\gamma = -\left(\frac{C_c + C_s}{C_c C_s R_c} + \frac{1}{C_s R_u}\right)$$

In one embodiment of implementation, the parametric model is formulated along with signals z and φ in the time domain based on equations (i), or in the discrete time domain based on equivalent formula. For example, z(t), whose Laplace transform is $$\frac{s^2 T_s - sT_{s,0}}{\Lambda(s)},$$

can be obtained by calculating the convolution of $T_s(t)-T_{s,0}$ and the inverse Laplace transform of $$\frac{s^2}{\Lambda(s)}.$$

In this way, calculation of the 2nd order derivative of $T_s$, $s^2 T_s$, which can be corrupted by noises, is avoided.

By using the parametric model in equation (iii), only three lumped parameters, α, β, and γ, can be identified under the condition of persistent input excitation. Prior knowledge of two of the physical parameters are to be assumed so as to determine a set of unique solution for the original five physical parameters, $C_c$, $C_s$, $R_e$, $R_c$, and $R_u$ from α, β, and γ. Of the five physical parameters, the internal electrical resistance $R_e$ may vary due to aging and is preferably identified online, the conduction resistance $R_c$ is not always easy to estimate, and the convection resistance $R_u$ can be influenced by coolant flow conditions around the battery cell 16. Accordingly, it is not always suitable to obtain prior knowledge of these parameters. But the heat capacities $C_c$ and $C_s$, which depend on the thermal properties and the mass of the rolled electrode assembly (i.e., core 18) and outer casing, may be relatively constant over the lifetime of the battery cell. Furthermore, the heat capacities $C_c$ and $C_s$ may only effect the speed of transient response of the model without having an impact on steady state temperatures. Accordingly, the heat capacities $C_c$ and $C_s$ can be selected as the presumed parameters.

With heat capacities $C_c$ and $C_s$ presumed and α, β, and γ identified, Re, Rc, and Ru can be obtained by solving the following set of equations (equations (iv)):

$$\beta(C_c + C_s)C_s R_u^2 + \gamma C_s R_u + 1 = 0$$

$$R_c = \frac{1}{\beta C_s C_c R_u}$$

$$R_e = \alpha C_c C_s R_c$$

The equation for $R_u$ in the equations (iv) can lead to two solutions, but the suitably correct solution can be decided based on coolant flow conditions.

The least squares algorithm in equations (i) can then be applied for parameter identification.

Adaptive Observer Design

Referring again to FIG. 1, in this embodiment the adaptive observer 12 can perform on-line parameter and state estimation simultaneously. Here, the adaptive observer 12 is a closed loop observer. Closed loop observers, such as a Luenberger observer or a Kalman filter, can be designed to estimate unmeasurable states of a system based on a model and feedback of measurable outputs $$\dot{\hat{x}} = A\hat{x} + Bu + L(y - \hat{y})$$

$$y = Cx = Du$$

$$\hat{y} = C\hat{x} + Du$$

where y is the measured system output, $\hat{x}$ and $\hat{y}$ are estimated states and output, L is the observer gain, and A, B, C, and D are model parameters. In the case of the governing equations set forth above for the core temperature $T_c$ state and the surface temperature $T_s$ state, and since the surface temperature $T_s$ is measurable $$x = [T_c T_s]^T,$$

$$y = T_s,$$

$$u = \left[I^2 \quad \frac{T_f - T_s}{R_u(V)}\right]^T$$

$$A = \begin{bmatrix} -\dfrac{1}{R_c C_c} & \dfrac{1}{R_c C_c} \\ \dfrac{1}{R_c C_s} & -\dfrac{1}{C_s R_c} \end{bmatrix},$$

$$B = \begin{bmatrix} \dfrac{R_e R_c}{C_c} & 0 \\ 0 & \dfrac{1}{C_s} \end{bmatrix},$$

$$C = [0 \ 1],$$

$$D = 0$$

In this embodiment, the difference between the measured and the estimated output is used as the feedback in order to correct the estimated states. Compared with an open loop observer (i.e., observer without output feedback), the closed loop observer can accelerate the convergence of the estimated states to those of the real plant under unknown initial conditions, e.g., a Luenberger observer, or optimize the estimation by balancing the effect of the process and measurement noises, e.g., a Kalman filter. Though an open loop observer may be suitable in some embodiments, a closed loop observer may be preferred in others.

In the closed loop observer embodiment, the adaptive observer 12 is designed by taking the structure of a closed loop observer and based on certainty equivalence principle $$C_c \dot{\hat{T}}_c = I^2 \hat{R}_e + \frac{\hat{T}_s - \hat{T}_c}{\hat{R}_c} + l_1(T_s - \hat{T}_s)$$

$$C_s \dot{\hat{T}}_s = \frac{T_f - \hat{T}_s}{\hat{R}_u} - \frac{\hat{T}_s - \hat{T}_c}{\hat{R}_c} + l_2(T_s - \hat{T}_s)$$

where $\hat{T}_s$ and $\hat{T}_c$ are the estimated surface and core temperatures, and the observer parameters $\hat{R}_e$, $\hat{R}_c$, and $\hat{R}_u$ are taken from the online identification set forth above. In the embodiment of FIG. 1, in real time the input current I, coolant temperature $T_f$, and the measured surface temperature $T_s$ are fed into the parameter identifier 10 in order to estimate model parameters $R_e$, $R_c$, and $R_u$. The adaptive observer 12 uses the estimated parameters in order to estimate the surface and core temperatures $\hat{T}_s$, $\hat{T}_c$. The estimated to surface temperature $\hat{T}_s$ is compared to the measured surface temperature $T_s$, and any error is fed back to correct the core temperature and surface temperature estimations. The estimations for both parameters and temperatures are updated at each time step.

Parameterization of Battery Thermal Model with Temperature Dependent $R_e$

In the example of lithium-ion batteries, internal electrical resistance $R_e$ can vary and may depend on core temperature $T_c$ and state of charge (SOC). In general, internal resistance $R_e$ can be increased when temperatures are low and when the SOC is close to 0% or 100%. An Arrhenius function can be used to describe the relationship between internal resistance $R_e$ and core temperature $T_c$ as $$R_e = R_{e,ref} \exp\left(\frac{T_{ref}}{T_c}\right).$$

where $R_{e,ref}$ is the reference internal electrical resistance value at a certain reference temperature $T_{ref}$, and $T_{ref}$ and $T_c$ are in K. Because, in the example of a vehicle, the change in internal resistance $R_e$ with respect to SOC is negligible under normal operating conditions (i.e., 20% to 80% SOC), the SOC is not considered in this embodiment. In other embodiments, the internal electrical resistance $R_e$ can be treated as a non-varying constant.

In order to address an internal resistance $R_e$ that varies with core temperature $T_c$ and suitably ensure avoidance of potential errors in previous estimations like the core temperature estimation, in this embodiment a least square algorithm with non-uniform forgetting factors is designed in order to identify $R_e$ as a time-varying parameter. In other embodiments, numerous methods could be employed to address a varying internal resistance; for example, the governing equations set forth above for the core temperature $T_c$ state and the surface temperature $T_s$ state can be linearized around a certain operating point to a linear model, and equations (i) set forth above can be applied to identify all constant parameters of the linearized model.

In this embodiment, when forgetting factors are adopted, a least square algorithm will be $$\dot{P}(t) = \eta^T P(t)\eta - P(t)\frac{\phi(t)\phi^T(t)}{m^2(t)}P(t)$$

where $\eta$ is the forgetting factor matrix.

In general, the least square identification algorithm attempts to find optimal parameters that best fit the inputs and outputs over the whole data set. A pure least square algorithm treats each data point as equal, no matter if it is acquired most recently, or obtained earlier. But when a forgetting factor is applied, the data points will be weighted differently. That is, the newly acquired data are favored over the older ones. In the equation immediately above, the weight of the data will decay exponentially with the time elapsed, and the larger the forgetting factor is, the faster the decay will be. Accordingly, the least square algorithm can track the parameters when they are time-varying.

The least square algorithm with forgetting factors can be applied to equation (ii) set forth above. Of the three lumped parameters in equation (ii)—$\alpha$, $\beta$, and $\gamma$—only $\alpha$ is related to time varying $R_e$, while all the others are constant. Therefore, non-uniform forgetting factors should be adopted in this embodiment with the $\eta$ matrix designed as $$\eta = \begin{bmatrix} \eta_1 & 0 & 0 \\ 0 & 0 & 0 \\ 0 & 0 & 0 \end{bmatrix}$$

where $\eta_1$ is the forgetting factor associated with $\alpha$ (and hence $R_e$).

The recursive least square algorithm with forgetting factors can also track the long term growth of the internal electrical resistance $R_e$, which can be used as an indication for and way to monitor the state of health (SOH) of the battery pack. Different from the varying internal resistance $R_e$ caused by fluctuating core temperature $T_c$, the long term growth of the internal resistance $R_e$ is due to a degradation and/or aging process occurring slowly over the battery's lifetime. For instance, the internal resistance $R_e$ could increase appreciably over hundreds of cycles or days.

FIG. 2A is a graph comparing simulated results (S) of internal electrical resistance growth, and identified (I) internal electrical resistance growth of the least square algorithm with non-uniform forgetting factors presented above. In the graph, internal electrical resistance $R_e$ is plotted on the y-axis, and time t is plotted on the x-axis. As shown, the simulated results (S) gradually increase over time with shorter-term variation caused by fluctuating core temperatures $T_c$; and the identified growth (I) closely follows the simulated results (S). As the internal resistance $R_e$ grows, the associated temperatures can also be elevated due to an increase in heat generated. In a vehicle application example, because the internal resistance $R_e$ is varying all the time, it may be challenging to evaluate SOH by the instantaneous value of $R_e$. Hence, averaged internal resistance $R_e$ may be preferred in some cases. FIG. 2B is a graph comparing mean or average values of the simulated results (S) and identified growth (I) of FIG. 2A. In the graph, average internal electrical resistance $R_e$ is plotted on the y-axis, and cycles are plotted on the x-axis. Skilled artisans will appreciate that other simulations and identifications may not yield the exact data shown in FIGS. 2A and 2B.

Scalable Battery Cluster Thermal Model and Sensor Deployment Analysis

In a vehicle application example, battery cells are oftentimes packed in modules in order to be suitable for desired energy and power demands. A thermal model for a battery cluster is therefore designed, and can then be used to design a thermal observer for the battery cluster. The parameters identified by the parameter identifier 10 can be updated in real time to the cluster thermal model for adaptation. In one embodiment, in order to optimize temperature estimation, a closed loop observer with surface temperature $T_s$ feedback is employed, which calls for observability.

Referring to FIG. 3, the governing equations set forth above for the core temperature $T_c$ state and the surface temperature $T_s$ state can be scaled up to a cluster thermal model based on thermal energy transfer effects such as battery cell-to-cell heat conduction 24 and heat balance of flowing coolant 26 travelling from an inlet 28 of a battery pack 30 to an outlet 32. As shown in FIG. 3, the battery pack 30, or cluster, can be simplified by considering modules with battery cells 16 connected in series with tab structures 34 and geometrically arranged in rows along the coolant traveling path. Coolant 22 flows through spaces between individual battery cells 16 from the inlet 28 to the outlet 32, and picks up heat dissipated from the battery cells' surfaces 20 via convection.

The temperature evolution of the kth cell in a cluster can be modeled as (equations (v))

$$C_c \frac{dT_{c,k}}{dt} = I^2 R_e + \frac{T_{s,k} - T_{c,k}}{R_c}$$

$$C_s \frac{dT_{s,k}}{dt} = \frac{T_{f,k} - T_{s,k}}{R_u} - \frac{T_{s,k} - T_{c,k}}{R_c} + \frac{T_{s,k-1} + T_{s,k+1} - 2T_{s,k}}{R_{cc}}$$

$$T_{f,k} = T_{f,k-1} + \frac{T_{s,k-1} - T_{f,k-1}}{R_u C_f}$$

where k is the index of the battery cell along the coolant flow direction.

In equations (v), heat conduction between battery cells is modeled as heat flow over conduction resistance $R_{cc}$, driven by the temperature difference between adjacent battery cell surfaces 20. In this embodiment, conduction resistance $R_{cc}$ is a lumped parameter and may include heat conduction through the tab structure 34 and through other possible connections between battery cells, depending on cluster and cell construction. Coolant flow temperature of the kth battery cell, $T_{f,k}$, can be determined by the flow heat balance of the previous battery cell, which can be calculated by dividing the heat removed $$\frac{T_{s,k-1} - T_{f,k-1}}{R_u}$$

from the k−1th battery cell by coolant flow capacity $C_f$. Here, it is assumed that all the battery cells have the same parameters and that the current is the same for all of the battery cells since the battery cluster is in series connection.

In general, coolant flow temperature at the inlet 28 is greater than coolant flow temperature at the outlet 32, since the coolant will pick up heat from the battery cells 16 as it travels from the inlet and to the outlet. Accordingly, surface and core temperatures $T_s$, $T_c$ of the battery cells may also increase from the inlet 28 and towards the outlet 32. In some embodiments, convection resistance $R_u$ for each battery cell can have the same value. But for some battery pack arrangements, it is possible that some battery cells may encounter different coolant flow conditions than others—e.g., battery cells closest to the inlet 28 and outlet 32 may have higher heat rejection capacity due to a larger space around them. And hence, battery cells in the middle of the battery pack may have the greatest surface and core temperatures $T_s$, $T_c$. In these instances, different $R_u$ values can be applied to the different battery cells in order to model the potential variations.

In the example vehicle application, because it is impractical to measure the surface temperature $T_s$ for every single battery cell in the battery pack, model based temperature monitoring can be utilized since it can estimate the surface and core temperatures $T_s$, $T_c$ for every single battery cell in the battery pack. The cluster thermal model, i.e., equations (v), can be employed for this purpose. In different embodiments, the model based temperature monitoring can be an open loop observer or a closed loop observer.

An open loop observer estimates states with the model based solely on input. In this instance, the current and coolant inlet temperature $T_f$ may be measured and applied to the equations (v) in order to calculate all of the temperatures in the battery pack. The open loop observer may give accurate state estimation if the initial conditions (i.e., temperatures) of all the temperature states are known, which may be the case when all the battery cells in the battery pack are at the coolant inlet temperature $T_f$. When the initial conditions are unknown or not available, the open loop observer state estimation will still converge to the real states gradually if the linear system is stable. The speed of convergence may be dictated by the system dynamics. A stable system here refers to systems whose states will all decay to zero subject to zero input.

In the example vehicle application, unknown initial conditions are not uncommon. Since temperature measurement sensors may be installed only on the battery cell surfaces 20, only the initial surface temperature can be obtained precisely at vehicle start-up operation while the initial core temperature remain unknown. If the vehicle and accompanying battery pack are started-up from steady states—such as after an overnight rest—the unmeasured and unknown initial core temperature of the battery cells can be assumed to be the same as the measured and known initial surface temperature. But this assumption may not be suitable for an abbreviated vehicle shutdown.

Figure 4A:
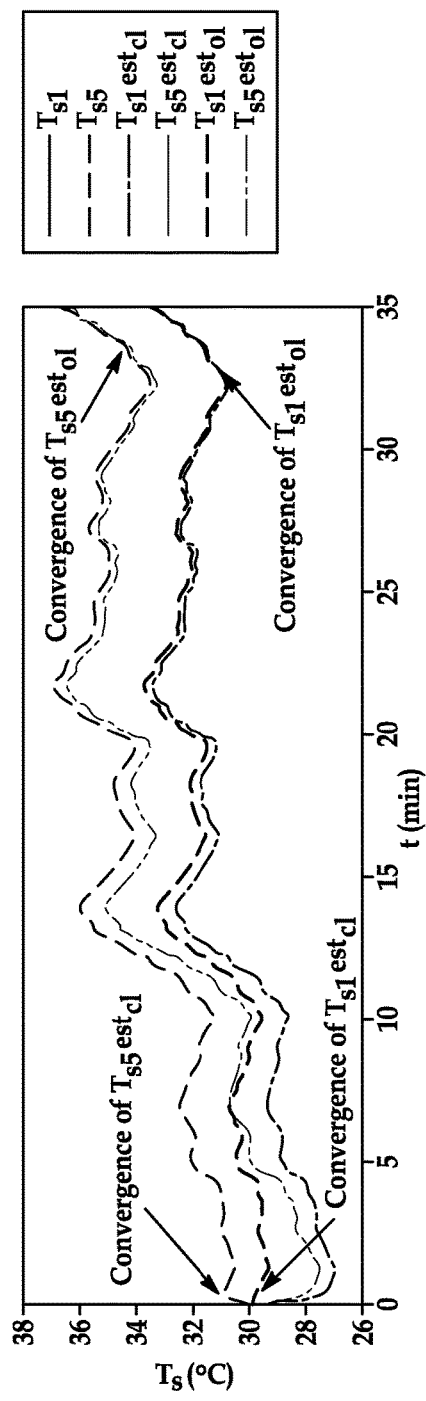
FIG. 4A is a graph showing simulated results of convergence times of estimated surface temperatures using a closed loop observer with real surface temperatures, and of convergence times of estimated surface temperatures using an open loop observer with real surface temperatures.

FIG. 4A is a graph showing simulated results of convergence times of estimated surface temperatures using a closed loop observer with real surface temperatures, and of convergence times of estimated surface temperatures using an open loop observer with real surface temperatures. In the graph, surface temperature $T_s$ is plotted on the y-axis, and time is plotted on the x-axis. For illustrative and demonstrative purposes, the battery pack subject to simulation had five individual battery cells provided in series similar to the arrangement depicted in FIGS. 5A, 5B, and only surface temperatures of battery cell one ("Cell1" in FIGS. 5A, 5B) and cell five ("Cell5" in FIGS. 5A, 5B) in the series are plotted in the graph. Furthermore, in the graph, $T_{s1}$ represents the simulated real surface temperature of cell one, $T_{s5}$ represents the simulated real surface temperature of cell five, $T_{s1estcl}$ represents the estimated surface temperature of cell one using a closed loop observer, $T_{s5estcl}$ represents the estimated surface temperature of cell five using a closed loop observer, $T_{s1estol}$ represents the estimated surface temperature of cell one using an open loop observer, and $T_{s5estol}$ represents the estimated surface temperature of cell five using an open loop observer.

Figure 4B:
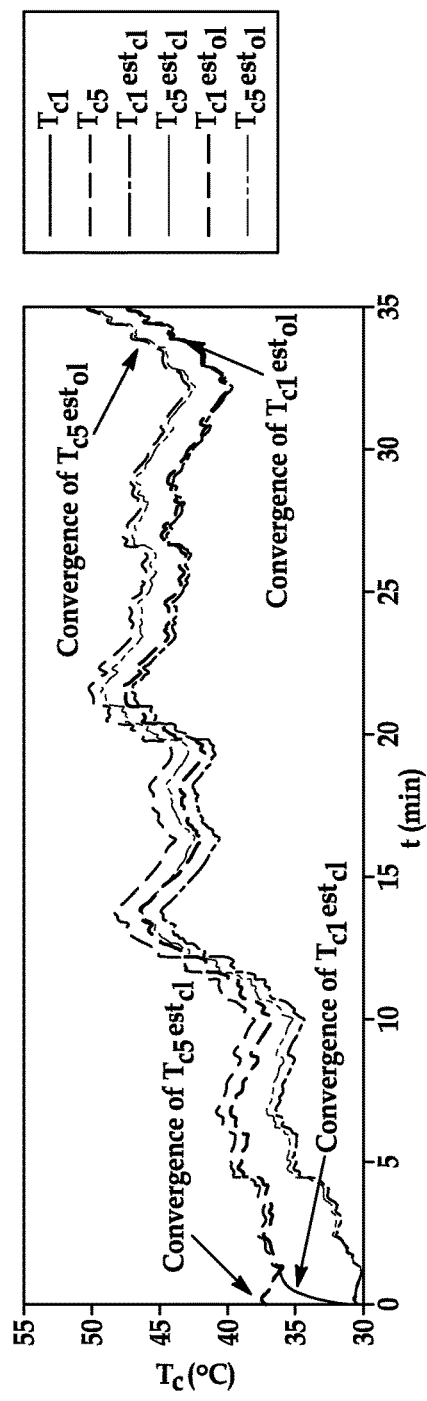
FIG. 4B is a graph showing simulated results of convergence times of estimated core temperatures using a closed loop observer with real core temperatures, and of convergence times of estimated core temperatures using an open loop observer with real core temperatures.

Similarly, FIG. 4B is a graph showing simulated results of convergence times of estimated core temperatures using a closed loop observer with real core temperatures, and of convergence times of estimated core temperatures using an open loop observer with real core temperatures. In the graph, core temperature $T_c$ is plotted on the y-axis, and time is plotted on the x-axis. Again here, for illustrative and demonstrative purposes, the battery pack subject to simulation had five individual battery cells provided in series similar to the arrangement depicted in FIGS. 5A, 5B, and only core temperatures of battery cell one ("Cell1" in FIGS. 5A, 5B) and cell five ("Cell5" in FIGS. 5A, 5B) in the series are plotted in the graph. Furthermore, in the graph, $T_{c1}$ represents the simulated real core temperature of cell one, $T_{c5}$ represents the simulated real core temperature of cell five, $T_{c1estcl}$ represents the estimated core temperature of cell one using a closed loop observer, $T_{c5estcl}$ represents the estimated core temperature of cell five using a closed loop observer, $T_{c1estol}$ represents the estimated core temperature of cell one using an open loop observer, and $T_{c5estol}$ represents the estimated core temperature of cell five using an open loop observer. The simulation in FIGS. 4A and 4B assume known parameters for all of the battery cells identified by the parameter identifier 10. Skilled artisans will appreciate that other simulations may not yield the exact data shown in FIGS. 4A and 4B.

In the simulation, the real initial surface and core temperatures of all the battery cells were set to be 30° C. and 37° C., respectively. For the open loop observer, the initial core temperatures are assumed to be the same as the measured surface temperatures, which are 30° C. FIGS. 4A and 4B show that the settling time for open loop estimation of the surface and core temperatures for both cell one and cell five is greater than thirty minutes (denoted "Convergence of $T_{s5}est_{ol}$," "Convergence of $T_{s1}est_{ol}$," "Convergence of $T_{c5}est_{ol}$," and "Convergence of $T_{c1}est_{ol}$" in FIGS. 4A and 4B). While such a settling time may be suitable in some embodiments, it may not be suitable in all embodiments.

Accordingly, in some embodiments, a closed loop observer can be employed for the model based temperature monitoring and may reduce the settling time compared to that of the open loop observer. In one embodiment, the closed loop observer may be designed as a Kalman filter, or could have another design. For the closed loop observer, some of the states (e.g., battery cell surface temperature) are measured and any errors between the measurement and the estimation are fed back to the model based observer in order to correct the estimation. Taking a battery cell string with two individual cells as an example, the closed loop observer takes the form of $\dot{\hat{x}}=A\hat{x}+Bu+L(y-\hat{y})$, $\hat{y}=C\hat{x}+Du$, where the A matrix and x, u, and B are (equations (vi))

$$A = \begin{bmatrix} -\dfrac{1}{R_c C_c} & \dfrac{1}{R_c C_c} & 0 & 0 \\ \dfrac{1}{R_c C_s} & -\left(\dfrac{\dfrac{1}{R_c C_s}+}{\dfrac{1}{R_u C_s}+\dfrac{1}{R_{cc}C_s}}\right) & 0 & \dfrac{1}{R_{cc}C_s} \\ 0 & 0 & -\dfrac{1}{R_c C_c} & \dfrac{1}{R_c C_c} \\ 0 & \left(\dfrac{1}{R_u^2 C_f C_s}+\dfrac{1}{R_{cc}C_s}\right) & \dfrac{1}{R_c C_c} & -\left(\dfrac{\dfrac{1}{R_u C_s}+}{\dfrac{1}{R_c C_s}+\dfrac{1}{R_{cc}C_s}}\right) \end{bmatrix}$$

$$x = [T_{c,1}\ T_{s,1}\ T_{c,2}\ T_{s,2}]^T, u = [I^2\ T_f]^T,$$

$$B = \begin{bmatrix} \dfrac{R_e}{C_c} & 0 \\ 0 & \dfrac{1}{R_u C_s} \\ \dfrac{R_e}{C_c} & 0 \\ 0 & \dfrac{R_u C_f - 1}{R_u^2 C_s C_f} \end{bmatrix}$$

If a thermocouple is used to measure the surface temperature of the second cell, then $$C=[0\ 0\ 0\ 1], D=0$$

In an embodiment in which the model is completely observable, by tuning the observer gains, the dynamics of the closed loop observer can be designed to be fast and the estimated temperatures will converge to the real plant temperatures much more quickly than the open loop estimation when starting from unknown initial temperatures. Accordingly, the previously-known and, in some case required, procedures of accurately determining the initial temperatures of battery cells in a battery pack may be eliminated in some embodiments described herein.

As mentioned, FIG. 4B shows simulated results of convergence times of estimated core temperatures using a closed loop observer with real core temperatures, and of convergence times of estimated core temperatures using an open loop observer with real core temperatures. As shown in this simulation example, the closed loop observer converges much sooner than the open loop observer. Both temperatures estimated by the closed loop observer converge to the real temperatures within 5 minutes.

In general, the effectiveness of a closed loop observer can be based on the observability of the battery pack model. The observability of a model can be examined by its observability matrix (equation (vii))

$$Q = \begin{bmatrix} C \\ CA \\ \dots \\ CA^{n-1} \end{bmatrix}$$

where A is the system matrix and C is the output matrix as in the equation $y=Cx+Du$, and n is the order of the system. The model will be completely observable if the rank of Q is equal to n.

As an example, a battery string with two individual battery cells, whose A matrix is specified under equations (vi), is looked at for simplicity. In the A matrix equation, the $$\frac{1}{R_{cc}C_s}$$

terms in the second and fourth rows reflect the thermal interaction between the two battery cells via cell-to-cell conduction. The $$\frac{1}{R_u^2 C_f C_s}$$

term in the fourth row represents the impact of the first battery cell on the second battery cell via coolant flow convection. The absence of this term in the second row indicates that such impact is unidirectional, and the second battery cell cannot influence the first battery cell via coolant convection. In this embodiment, the C matrix will be determined by the location of the temperature sensor. For instance, if the surface temperature of cell one is measured, then $C_1=[0\ 1\ 0\ 0]$, and if the surface temperature of cell two is measured, then $C_2=[0\ 0\ 0\ 1]$. Further, if all of the elements in the A matrix are assigned with values assumed in this description and applied to equation (vii) to calculate Q, it can be found that the rank of Q will be four when either $C_1$ or $C_2$ is applied. This means that, in this example with two individual battery cells, either measuring the first or the second battery cell will provide full observability.

As another example, a battery string with three individual battery cells has an A matrix $$A\_3cell = \begin{bmatrix} -\frac{1}{R_c C_c} & \frac{1}{R_c C_c} & 0 & 0 & 0 & 0 \\ \frac{1}{R_c C_s} & -\left(\frac{\frac{1}{R_c C_s}+}{\frac{1}{R_u C_s}+\frac{1}{R_{cc}C_s}}\right) & 0 & \frac{1}{R_{cc}C_s} & 0 & 0 \\ 0 & 0 & -\frac{1}{R_c C_c} & \frac{1}{R_c C_c} & 0 & 0 \\ 0 & \frac{1}{R_u^2 c_f c_s}+\frac{1}{R_{cc}C_s} & \frac{1}{R_c C_s} & -\left(\frac{\frac{1}{R_u C_s}+}{\frac{1}{R_c C_s}+\frac{1}{R_{cc}C_s}}\right) & 0 & \frac{1}{R_{cc}C_s} \\ 0 & 0 & 0 & 0 & -\frac{1}{R_c C_s} & \frac{1}{R_c C_c} \\ 0 & \frac{1}{R_u^2 c_f c_s}\left(1-\frac{1}{R_u c_f}\right) & 0 & \frac{1}{R_u^2 c_f c_s}+\frac{1}{R_{cc}C_s} & \frac{1}{R_c C_s} & -\left(\frac{\frac{1}{R_c C_s}+}{\frac{1}{R_u C_s}+\frac{1}{R_{cc}C_s}}\right) \end{bmatrix}$$

In this example, the $$\frac{1}{R_{cc}C_s}$$

terms in the second, fourth, and sixth rows reflect the interaction between the adjacent battery cells via cell-to-cell conduction, and the $$\frac{1}{R_u^2 C_f C_s}$$

term in the fourth row accounts for the impact of the first battery cell on the second battery cell by coolant flow convection. Additional details concerning the battery cell interconnection via coolant convection can be revealed by looking at the sixth row of the A matrix. In the sixth row, the $$\frac{1}{R_u^2 C_f C_s}$$

term in the fourth column represents the impact of the second battery cell on the third battery cell through coolant convection, and the $$\frac{1}{R_u^2 c_f c_s} - \frac{1}{R_u^3 c_f^2 c_s}$$

term in the second column describes such impact of the first battery cell on the third battery cell. Indeed, all of the previous battery cells in the battery string may affect the subsequent battery cells through coolant flow convection, and the farther apart the two battery cells physically are, the weaker the effect may be. The coolant convection effects are different than the cell-to-cell conduction effects, as the conduction effects may only exist between adjacently connected battery cells and the strength may always be the same.

Furthermore, for battery cell strings having any number of battery cells, once the particular A matrix is established, observability analysis can be performed in order to determine the minimum number of temperature sensors needed to provide full observability. Results are provided below in Table 1.

TABLE 1

| Number of Cells in the String | Minimum Number of Sensors Suitable |
|---|---|
| 1, 2, 3 | 1 |
| 4, 5, 6 | 2 |
| 7, 8, 9 | 3 |
| 10, 11, 12 | 4 |

It has been determined that for battery cell strings with greater than five battery cells, the location of the temperature sensors on the surfaces of the cells has an effect on observability. For example, in a battery cell string with five battery cells, although the minimum number of temperature sensors to establish full observability is two sensors, different sensor locations among the battery cells may give different results concerning observability. This is demonstrated in FIGS. 5A and 5B, where coolant flow travels from left to right and neighboring individual battery cells are connected to each other via a tab structure. When two temperature sensors are placed on the surfaces of battery cells one and two in the example battery cell string of FIG. 5A (denoted "Cell1" and "Cell2" respectively), as shown, the rank of the Q matrix will be less than 10, and hence full observability may not be suitably satisfied. But in FIG. 5B when two temperature sensors are placed on the surface of battery cells one and five in the example battery cell string of FIG. 5B (denoted "Cell1" and "Cell5" respectively), as shown, the Q matrix will be of full rank and may thus provide full observability.

In general, observability indicates the possibility of determining all the states based on the available measurements and the model. The model defines the relations between different states and therefore in order to achieve full observability, the measurements should be able to provide enough constraints to restrict the states to a single set of solution based on the model. In the example of FIGS. 5A and 5B, when the temperature sensors are located on battery cells one and two (FIG. 5A), the constraints provided by the temperature sensors may be somewhat redundant at the beginning portion of the battery cell string since the surface temperature of battery cell two can be estimated based on the measured surface temperature of battery cell one and the model. Because there is no surface temperature measurement in the end portion of the battery cell string, the temperatures of the battery cells in that portion cannot suitably be constrained to unique values. Accordingly, full observability may not be suitably satisfied. In contrast, when the temperature sensors are located on battery cells one and five (FIG. 5B), constraints may be imposed on the battery cell string evenly, and therefore all the states can be determined by the surface temperature measurements and the model.

Furthermore, it has been determined that, in some cases, the thermal energy transfer effects among the battery cells may be weaker if either battery cell-to-cell heat conduction or coolant convection is absent or negligible. For instance, cell-to-cell heat conduction may be minor in some battery packs due to the shape and/or material of the accompanying tab structure. Also, when the coolant flow is not circulated through the battery pack—such as when there is a battery thermal management system breakdown or fault—the battery cells would then be cooled by way of natural convection and preceding battery cells may not effect subsequent battery cells via coolant convection. In these circumstances, the observability conditions will be different. For example, taking the battery cell string of FIGS. 5A and 5B, when coolant circulation is disabled and the battery cells are cooled by natural convection, and when two temperature sensors are placed on the surfaces of battery cells one and two, full observability may still be satisfied. In contrast, when battery cell-to-cell heat conduction is absent, temperature sensors at battery cells one and two may not suitably satisfy full observability.

In an example, a battery cell string having twelve battery cells was analyzed in terms of observability. The results of that analysis are provided below in Table 2. For twelve battery cells, according to Table 1, the minimum number of temperature sensors to give full observability is four. Table 2 shows that, among all of the four-hundred-and-ninety-five possible combinations of locations among the battery cells of the four temperature sensors, when there is both circulated coolant convection and cell-to-cell heat conduction ("Full Cell Interconnection"), one-hundred-and-six combinations will give full observability. When there is natural convection with no coolant flow but still cell-to-cell heat conduction ("Natural Convection Effects"), fifty-two combinations will give full observability. And when cell-to-cell heat conduction is absent ("No Cell-to-Cell Conduction"), only one combination will give full observability—that combination would be locating temperature sensors on the surfaces of battery cells three, six, nine, and twelve in the battery cell string.

TABLE 2

| Conditions | Number of Combinations Providing Observability |
|---|---|
| Full Cell Interconnection | 106/495 |
| Natural Convection Effects | 52/495 |
| No Cell-to-Cell Conduction | 1/495 |

Cell-to-cell heat conduction tends to have a greater effect on observability than coolant convection. One possible reason for this is that cell-to-cell heat conduction is a two-way thermal energy transfer effect that is, heat can be exchanged between both battery cells in both directions. Coolant convection, in contrast, may provide thermal energy transfer effects in a single direction. According to this, battery packs can be constructed with tab structures among the battery cells that facilitate cell-to-cell heat conduction and hence provide greater observability. One example of such a construction may be a physically larger sized tab structure and/or a tab structure composed of a material having greater heat conduction properties. This may also reduce temperature gradient among the battery cells and therefore limit imbalance among the cells induced by temperature non-uniformity.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of estimating core temperatures of battery cells in a battery pack, the method comprising:
   a) dynamically receiving a surface temperature of less than all of the battery cells in the battery pack, a current of the less than all battery cells, an inlet temperature of coolant provided to the battery pack, and a flow rate or velocity of the coolant;
   b) dynamically estimating a cell-lumped internal electrical resistance of the less than all battery cells, a cell-lumped conduction resistance between a core and a surface of the less than all battery cells, and a cell-lumped convection resistance between the surface of the less than all battery cells and the coolant, the estimations based upon the received values of step a);
   c) dynamically estimating a core temperature and a surface temperature of the less than all battery cells based upon the received values of step a) and based upon the estimated values of step b); and
   d) using thermal energy transfer effects between the coolant and the battery cells, thermal energy transfer effects among the battery cells, and the estimated core temperature values of step c), in order to estimate the core temperatures for all of the battery cells in the battery pack; and
   e) comparing the received surface temperature values of step a) and the estimated surface temperature values of step c) in order to correct the estimation of the core temperatures of all of the battery cells in the battery pack.

2. The method of claim 1 further comprising determining a quantity and a location of at least one sensor with respect to the battery cells based at least in part upon an observability analysis and thermal energy transfer effects in the battery pack.

3. The method of claim 1 wherein step b) further comprises dynamically estimating a heat capacity of the core of the less than all battery cells, and a heat capacity of the surface of the less than all battery cells, the estimations based upon the received values of step a).

4. The method of claim 3 further comprising determining the state of health of the battery pack based upon the dynamically estimated internal electrical resistance of the less than all battery cells.

5. The method of claim 3 wherein the thermal energy transfer effects between the coolant and the battery cells comprise convection effects between the coolant and the battery cells, and the thermal energy transfer effects among the battery cells comprise conduction effects among the battery cells.

6. The method of claim 3 wherein steps a), b), c), and d) are performed on a controller, and the estimated core temperatures are used for thermal management of the battery pack.

7. The method of claim 6 wherein at least some of the received surface temperature, current, inlet temperature, and flow rate or velocity are measured via at least one sensor coupled to the controller.

8. The method of claim 3 further comprising determining a connection construction among the battery cells and a spacing distance among the battery cells based at least in part upon an observability analysis and thermal energy transfer effects in the battery pack.

9. A computer readable medium comprising a non-transient data storage device having stored thereon instructions that carry out the method of claim 3.

10. A method of estimating core temperatures of battery cells in a battery pack, the method comprising:
    a) dynamically receiving a surface temperature of at least one battery cell in the battery pack, a current of the at least one battery cell, an inlet temperature of coolant provided to the battery pack, and a flow rate or velocity of the coolant;
    b) dynamically estimating a cell-lumped internal electrical resistance of the at least one battery cell, a cell-lumped conduction resistance between a core and a surface of the at least one battery cell, and a cell-lumped convection resistance between the surface of the at least one battery cell and the coolant, the estimations based upon the received values of step a);
    c) dynamically estimating a core temperature of the at least one battery cell and a surface temperature of the at least one battery cell, based upon the received values of step a) and based upon the estimated values of step b); and
    d) comparing the received surface temperature values of step a) and the estimated surface temperature values of step c) in order to correct the estimation of the core and surface temperatures of the at least one battery cell of step c).

11. The method of claim 10 further comprising using thermal energy transfer effects between the coolant and the battery cells, and thermal energy transfer effects among the battery cells in order to estimate the core temperatures for all of the battery cells in the battery pack.

12. The method of claim 10 further comprising dynamically estimating a heat capacity of the core of the at least one battery cell, and a heat capacity of the surface of the at least one battery cell, the estimations based upon the received values of step a).

13. The method of claim 10 further comprising determining the state of health of the battery pack based upon the dynamically estimated internal electrical resistance of the at least one battery cell.

14. A computer readable medium comprising a non-transient data storage device having stored thereon instructions that carry out the method of claim 10.

15. A system for estimating core temperatures of battery cells in a battery pack, the system comprising:
    at least one sensor coupled to at least one battery cell of the battery pack in order to measure a surface temperature of the at least one battery cell;
    a controller coupled to the at least one sensor in order to receive the measured surface temperature, wherein the controller performs the steps of:
    i) receiving a current of the at least one battery cell, an inlet temperature of coolant provided to the battery pack, and a flow rate or velocity of the coolant;
    ii) estimating a cell-lumped internal electrical resistance of the at least one battery cell, a cell-lumped conduction resistance between a core and a surface of the at least one battery cell, and a cell-lumped convection resistance between the surface of the at least one battery cell and the coolant, the estimations based upon the measured surface temperature and the received values of step i);

iii) estimating a core temperature of the at least one battery cell based upon the measured surface temperature, the received values of step i), and the estimated values of step ii);

iv) using thermal energy transfer effects between the coolant and the battery cells, thermal energy transfer effects among the battery cells, and the estimated core temperature values of step iii), in order to estimate the core temperatures for all of the battery cells in the battery pack; and v) estimating a surface temperature of the at least one battery cell and comparing the measured surface temperature and the estimated surface temperature in order to correct the estimation of the core temperatures for all of the battery cells in the battery pack; and a battery thermal management assembly coupled to the controller and controlled by the controller based upon the estimated core temperatures for all of the battery cells in the battery pack.

16. The system of claim 15 wherein the controller further performs the step of determining the state of health of the battery pack based upon the estimated internal electrical resistance of the at least one battery cell.

* * * * *